US012534807B2

United States Patent
(12) United States Patent
Fitzgerald et al.

(10) Patent No.: US 12,534,807 B2
(45) Date of Patent: Jan. 27, 2026

(54) BAFFLE FOR A REACTOR SYSTEM

(71) Applicant: ASM IP Holding B.V., Almere (NL)

(72) Inventors: Thomas Fitzgerald, Gilbert, AZ (US); Ruchik Bhatt, Chandler, AZ (US)

(73) Assignee: ASM IP Holding B.V., Almere (NL)

(*) Notice: Subject to any disclaimer, the term of this patent is extended or adjusted under 35 U.S.C. 154(b) by 659 days.

(21) Appl. No.: 17/896,557

(22) Filed: Aug. 26, 2022

(65) Prior Publication Data

US 2023/0063286 A1 Mar. 2, 2023

Related U.S. Application Data

(60) Provisional application No. 63/238,969, filed on Aug. 31, 2021.

(51) Int. Cl.
*C23C 16/40* (2006.01)
*C23C 16/455* (2006.01)

(52) U.S. Cl.
CPC .. *C23C 16/45591* (2013.01); *C23C 16/45544* (2013.01)

(58) Field of Classification Search
CPC ........ C23C 16/45591; C23C 16/45544; C23C 16/4401; C23C 16/45561; H01L 21/6719; H01J 37/3244; H01J 37/32449
USPC ........................ 118/715; 156/345.33, 345.34
See application file for complete search history.

(56) References Cited

U.S. PATENT DOCUMENTS

| | | | | |
|---|---|---|---|---|
| 5,884,009 | A * | 3/1999 | Okase | H01L 21/67017 392/416 |
| 6,402,848 | B1 * | 6/2002 | Horiguchi | C23C 16/45565 118/715 |
| 7,229,666 | B2 * | 6/2007 | Mardian | C23C 16/4401 427/248.1 |
| 2006/0264045 | A1 | 11/2006 | Gu | |
| 2015/0361553 | A1 * | 12/2015 | Murakawa | C23C 16/45561 156/345.55 |
| 2017/0218515 | A1 * | 8/2017 | Shin | C23C 16/4412 |
| 2019/0385873 | A1 * | 12/2019 | Yamagishi | H01L 21/67739 |
| 2021/0071296 | A1 * | 3/2021 | Watarai | H01J 37/3288 |

FOREIGN PATENT DOCUMENTS

| | | | |
|---|---|---|---|
| CN | 105088193 | B | 11/2017 |
| CN | 112495336 | A | 3/2021 |
| CN | 113802113 | A | 12/2021 |
| KR | 20170040815 | A | 4/2017 |
| WO | 8707310 | W | 12/1987 |
| WO | 2008016836 | A2 | 2/2008 |
| WO | 2018121603 | A1 | 7/2018 |

* cited by examiner

*Primary Examiner* — Rudy Zervigon
(74) *Attorney, Agent, or Firm* — Snell & Wilmer L.L.P.

(57) ABSTRACT

A baffle for use in a reaction chamber may comprise a baffle first end, a baffle second end, and a baffle space enclosed by a baffle wall system and the reaction chamber floor, wherein the baffle first end may comprise a baffle aperture disposed therethrough configured to allow a fluid to flow from the reaction chamber volume into the baffle space through the baffle aperture and exit the baffle space through a vacuum aperture in the reaction chamber floor toward a vacuum source.

13 Claims, 6 Drawing Sheets

BAFFLE FOR A REACTOR SYSTEM

CROSS-REFERENCE TO RELATED APPLICATIONS

This application is a nonprovisional of, and claims priority to and the benefit of, U.S. Provisional Patent Application No. 63/238,969, filed Aug. 31, 2021 and entitled "BAFFLE FOR A REACTOR SYSTEM," which is hereby incorporated by reference herein.

FIELD OF THE DISCLOSURE

The present disclosure relates generally to a semiconductor processing or reactor systems, and particularly to a baffle for use in a reaction chamber to direct fluid flow.

BACKGROUND OF THE DISCLOSURE

Reaction chambers may be used for a variety of processes during formation of electronic devices. For example, reaction chambers can be used for depositing various material layers onto semiconductor substrates, etching materials, and/or cleaning surfaces. A substrate may be placed on a susceptor inside a reaction chamber. Both the substrate and the susceptor may be heated to a desired substrate temperature set point. In an example process, one or more reactant gases may be passed over a heated substrate, causing the deposition of a thin film of material on the substrate surface.

Before, during, and/or after processing of a substrate, to evacuate fluids from the reaction chamber, a vacuum source may be in fluid communication with the reaction chamber volume, causing fluids in the reaction chamber to flow out of the reaction chamber toward the vacuum source. The fluids will choose the path of least resistance to exit the reaction chamber toward the vacuum source. However, if a vacuum source is in a position that is offset from the center of the reaction chamber, susceptor, substrate, and/or the like, the vacuum source may cause more fluid to flow within one portion of the reaction chamber (and over one portion of the substrate) relative to other portions. Thus, deposition upon the substrate being processed may be unevenly distributed, with more deposition occurring on the portion over which more fluid flowed. However, greater deposition uniformity may be desired.

Any discussion of problems and solutions involved in the related art has been included in this disclosure solely for the purposes of providing a context for the present disclosure, and should not be taken as an admission that any or all of the discussion was known at the time the invention was made.

SUMMARY OF THE DISCLOSURE

This summary is provided to introduce a selection of concepts in a simplified form. These concepts are described in further detail in the detailed description of example embodiments of the disclosure below. This summary is not intended to identify key features or essential features of the claimed subject matter, nor is it intended to be used to limit the scope of the claimed subject matter.

In various embodiments, a reaction chamber may comprise a sidewall system; a fluid distribution system; a reaction chamber floor; a reaction chamber volume at least partially enclosed by the sidewall system, the fluid distribution system, and the reaction chamber floor; a susceptor disposed within the reaction chamber volume configured to support a substrate; a susceptor shaft coupled to and supporting the susceptor, wherein the susceptor shaft may be disposed through the reaction chamber floor; a vacuum source fluidly coupled to the reaction chamber volume via a vacuum aperture disposed through the reaction chamber floor; and/or a baffle coupled to the reaction chamber floor. The baffle may comprise a baffle first end at least partially surrounding the susceptor shaft and a baffle second end disposed over the vacuum aperture. The baffle may comprise a baffle space enclosed by a baffle wall system and the reaction chamber floor, wherein the baffle first end may comprise a baffle aperture disposed therethrough configured to allow a fluid to flow from the reaction chamber volume into the baffle space through the baffle aperture and exit the baffle space through the vacuum aperture in the reaction chamber floor. In various embodiments, the baffle first end may comprise a baffle first end void, through which the susceptor shaft is disposed. In various embodiments, the baffle first end may be disposed completely around the susceptor shaft.

In various embodiments, the reaction chamber volume may be in fluid communication with the vacuum source via the baffle aperture and the baffle space in the baffle. In various embodiments, the baffle wall system may form at least a partial seal with the reaction chamber floor. In various embodiments, the baffle wall system may comprise a baffle sidewall system surrounding the baffle space and a baffle upper wall facing the reaction chamber volume, wherein the baffle aperture may be disposed in at least one of the baffle upper wall and the baffle sidewall system.

In various embodiments, the baffle first end may comprise a distal portion that is a baffle first end portion furthest from the vacuum aperture. The baffle aperture may be disposed in the distal portion. In various embodiments, the susceptor shaft may be disposed between the vacuum aperture and at least a portion of the distal portion of the baffle first end. In various embodiments, the baffle first end may comprise a perimeter shape comprising the distal portion, wherein the distal portion of the perimeter shape may be a quarter, a third, or a half of the perimeter shape that is disposed furthest from the vacuum aperture. In various embodiments, the baffle may comprise a plurality of baffle apertures disposed through the baffle wall system on the baffle first end. In various embodiments, the plurality of baffle apertures may be disposed only on the distal portion of the baffle first end. In various embodiments, a majority of the baffle apertures may be disposed on the distal portion of the baffle first end.

In various embodiments, the baffle may comprise at least one of a metal material, a ceramic material, or quartz.

In various embodiments, a baffle configured for use in a reaction chamber may comprise a baffle wall system spanning between a baffle first end and a baffle second end; a baffle aperture disposed through the baffle first end of the baffle wall system; and/or a baffle space at least partially defined and surrounded by the baffle wall system, wherein the baffle space is exposed through an open side of the baffle, wherein the baffle space is in fluid communication with the baffle aperture. A bottom surface of the baffle wall system may be configured to couple to a reaction chamber floor to further enclose the baffle space.

In various embodiments, the baffle wall system may comprise a baffle sidewall system surrounding the baffle space and a baffle upper wall configured to face a reaction chamber volume of the reaction chamber. The baffle aperture may be disposed in at least one of the baffle upper wall and the baffle sidewall system. In various embodiments, the baffle may further comprise a tab protruding from the baffle second end. The tab may comprise a coupling hole disposed therethrough configured to receive a fastener to couple the baffle to the reaction chamber floor.

In various embodiments, the baffle first end may comprise a distal portion that is furthest from the baffle second end, wherein the baffle aperture may be disposed in the distal portion. In various embodiments, the baffle first end may comprise a perimeter shape comprising the distal portion, wherein the distal portion of the perimeter shape may be a quarter, a third, or a half of the perimeter shape that is disposed furthest from the baffle second end. In various embodiments, the baffle may further comprise a plurality of baffle apertures disposed through the baffle wall system on the baffle first end, wherein a majority of the baffle apertures may be disposed on the distal portion of the baffle first end. In various embodiments, the baffle first end may comprise a baffle first end void configured to receive a susceptor shaft in the reaction chamber.

For the purpose of summarizing the disclosure and the advantages achieved over the prior art, certain objects and advantages of the disclosure have been described herein above. Of course, it is to be understood that not necessarily all such objects or advantages may be achieved in accordance with any particular embodiment of the disclosure. Thus, for example, those skilled in the art will recognize that the embodiments disclosed herein may be carried out in a manner that achieves or optimizes one advantage or group of advantages as taught or suggested herein without necessarily achieving other objects or advantages as may be taught or suggested herein.

All of these embodiments are intended to be within the scope of the disclosure. These and other embodiments will become readily apparent to those skilled in the art from the following detailed description of certain embodiments having reference to the attached figures, the disclosure not being limited to any particular embodiment(s) discussed.

BRIEF DESCRIPTION OF THE DRAWING FIGURES

While the specification concludes with claims particularly pointing out and distinctly claiming what are regarded as embodiments of the disclosure, the advantages of embodiments of the disclosure may be more readily ascertained from the description of certain examples of the embodiments of the disclosure when read in conjunction with the accompanying drawings. Elements with the like element numbering throughout the figures are intended to be the same.

Figure 1:
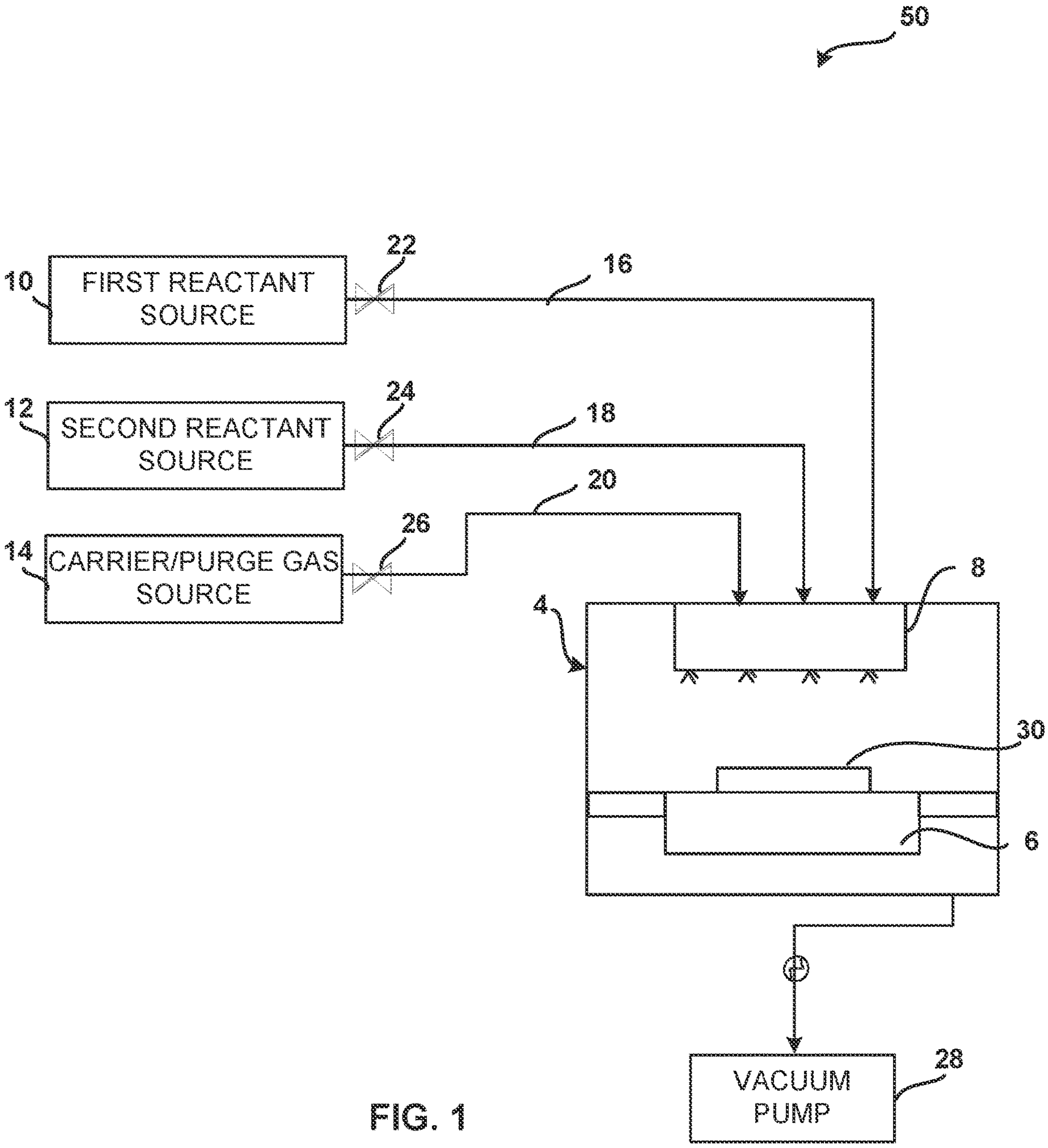
FIG. 1 is a schematic diagram of an exemplary reactor system, in accordance with various embodiments.

It will be appreciated that elements in the figures are illustrated for simplicity and clarity and have not necessarily been drawn to scale. For example, the dimensions of some of the elements in the figures may be exaggerated relative to other elements to help improve understanding of illustrated embodiments of the present disclosure.

DETAILED DESCRIPTION

Although certain embodiments and examples are disclosed below, it will be understood by those in the art that the disclosure extends beyond the specifically disclosed embodiments and/or uses of the disclosure and obvious modifications and equivalents thereof. Thus, it is intended that the scope of the disclosure should not be limited by the particular embodiments described herein.

The illustrations presented herein are not meant to be actual views of any particular material, apparatus, structure, or device, but are merely representations that are used to describe embodiments of the disclosure.

As used herein, the term "substrate" may refer to any underlying material or materials that may be used, or upon which, a device, a circuit, or a film may be formed.

As used herein, the term "atomic layer deposition" (ALD) may refer to a vapor deposition process in which deposition cycles, preferably a plurality of consecutive deposition cycles, are conducted in a process chamber. Typically, during each cycle the precursor is chemisorbed to a deposition surface (e.g., a substrate surface or a previously deposited underlying surface such as material from a previous ALD cycle), forming a monolayer or sub-monolayer that does not readily react with additional precursor (i.e., a self-limiting reaction). Thereafter, if necessary, a reactant (e.g., another precursor or reaction gas) may subsequently be introduced into the process chamber for use in converting the chemisorbed precursor to the desired material on the deposition surface. Typically, this reactant is capable of further reaction with the precursor. Further, purging steps may also be utilized during each cycle to remove excess precursor from the process chamber and/or remove excess reactant and/or reaction byproducts from the process chamber after conversion of the chemisorbed precursor. Further, the term "atomic layer deposition," as used herein, is also meant to include processes designated by related terms such as, "chemical vapor atomic layer deposition", "atomic layer epitaxy" (ALE), molecular beam epitaxy (MBE), gas source MBE, or organometallic MBE, and chemical beam epitaxy when performed with alternating pulses of precursor composition(s), reactive gas, and purge (e.g., inert carrier) gas.

As used herein, the term "chemical vapor deposition" (CVD) may refer to any process wherein a substrate is exposed to one or more volatile precursors, which react and/or decompose on a substrate surface to produce a desired deposition.

As used herein, the term "film" and "thin film" may refer to any continuous or non-continuous structures and material deposited by the methods disclosed herein. For example, "film" and "thin film" could include 2D materials, nanorods, nanotubes, or nanoparticles or even partial or full molecular layers or partial or full atomic layers or clusters of atoms and/or molecules. "Film" and "thin film" may comprise material or a layer with pinholes, but still be at least partially continuous.

As used herein, the term "contaminant" may refer to any unwanted material disposed within the reaction chamber that may affect the purity of a substrate disposed in the reaction chamber. The term "contaminant" may refer to, but is not limited to, unwanted deposits, metal and non-metal particles, impurities, and waste products, disposed within the reactor system or reaction chamber, or any portion thereof.

Reactor systems described herein may be used for a variety of applications, including depositing, etching, and/or cleaning materials on a substrate surface. By way of particular examples, the reactor systems can be used for CVD and/or cyclical processes, such as ALD. In various embodiments, with reference to FIG. 1, a reactor system 50 may comprise a reaction chamber 4, a susceptor 6 to hold a substrate 30 during processing, a fluid distribution system 8 (e.g., a showerhead) to distribute one or more reactants to a surface of substrate 30, one or more reactant sources 10, 12, and/or a carrier and/or purge gas source 14, fluidly coupled to reaction chamber 4 via lines 16-20 and valves or controllers 22-26. System 50 may also comprise a vacuum source 28 fluidly coupled to the reaction chamber 4.

During processing, reactants and/or purge gases may flow to the reaction chamber. Before, during, and/or after processing, vacuum pump 28 may provide vacuum pressure to remove the gases from the reaction chamber. The gases will follow through the path of least resistance in order to exit the reaction chamber toward the vacuum source. Thus, if the vacuum source (or the fluid connection thereto within the reaction chamber) is offset from a center of the reaction chamber, substrate, susceptor, or the like, more gas may pass over the portion of the substrate more proximate to the connection to the vacuum source. Thus, such a portion of the substrate may receive more contact with the reactant gases, and thus, receive more deposition thereon. For example, as depicted and viewed in FIG. 1, the portion of substrate 30 toward the right in FIG. 1 may receive more contact with fluids in reaction chamber 4 because the fluid connection between reaction chamber 4 and vacuum pump 28 is on the right side of reaction chamber 4 (as viewed in FIG. 1).

In accordance with examples of the disclosure, a baffle is disposed in the reaction chamber to direct fluid flow in a desired manner. The baffle may provide a fluid flow path that creates substantially equidistant flow paths for fluid within the reaction chamber, thus creating more equal fluid flow through the reaction chamber and contacting the various portions of the substrate as the fluid travels toward the vacuum source.

Figure 2A:
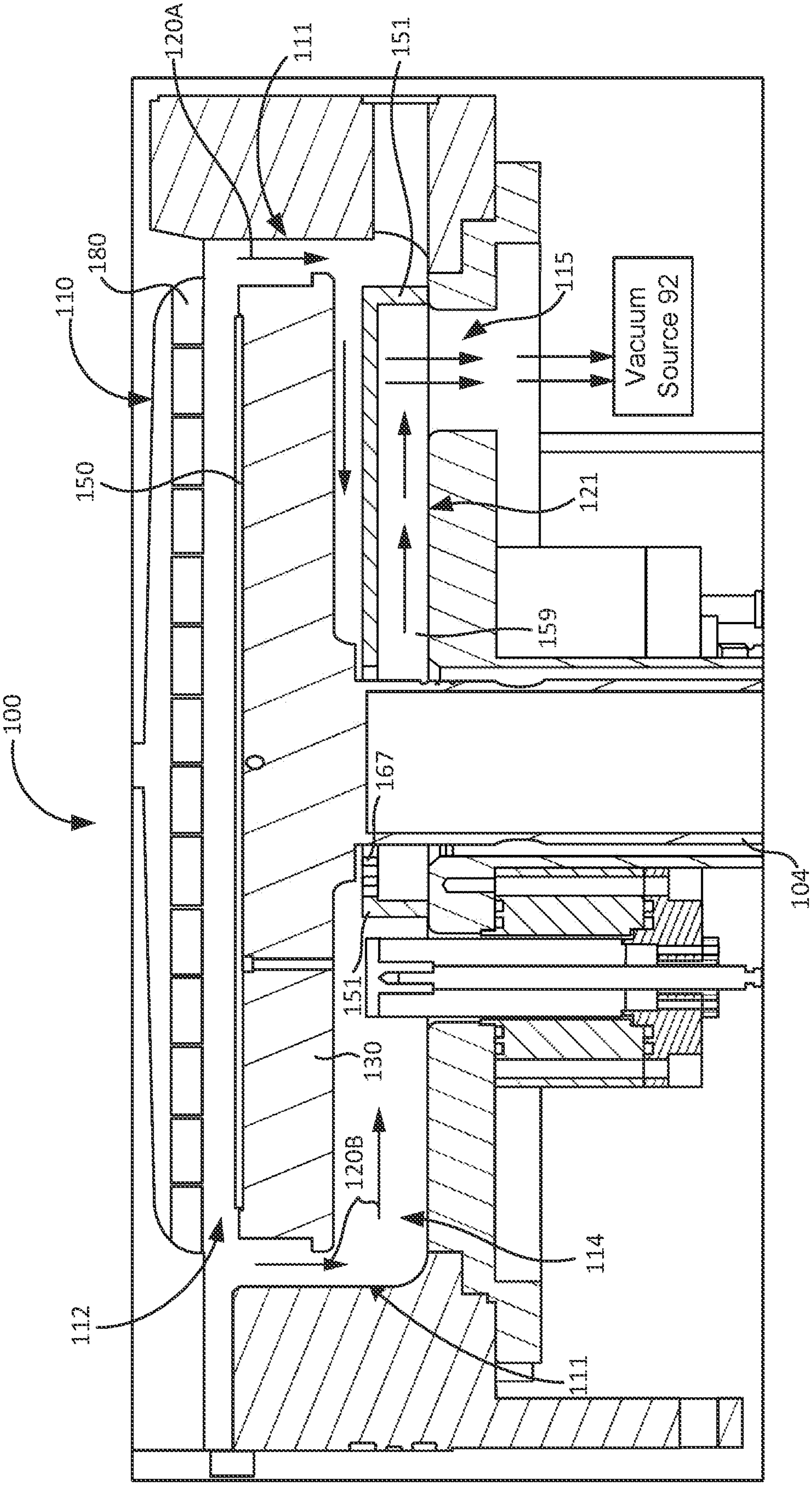
FIG. 2A depicts a cross-sectional view of a reaction chamber, in accordance with various embodiments.
Figure 2B:
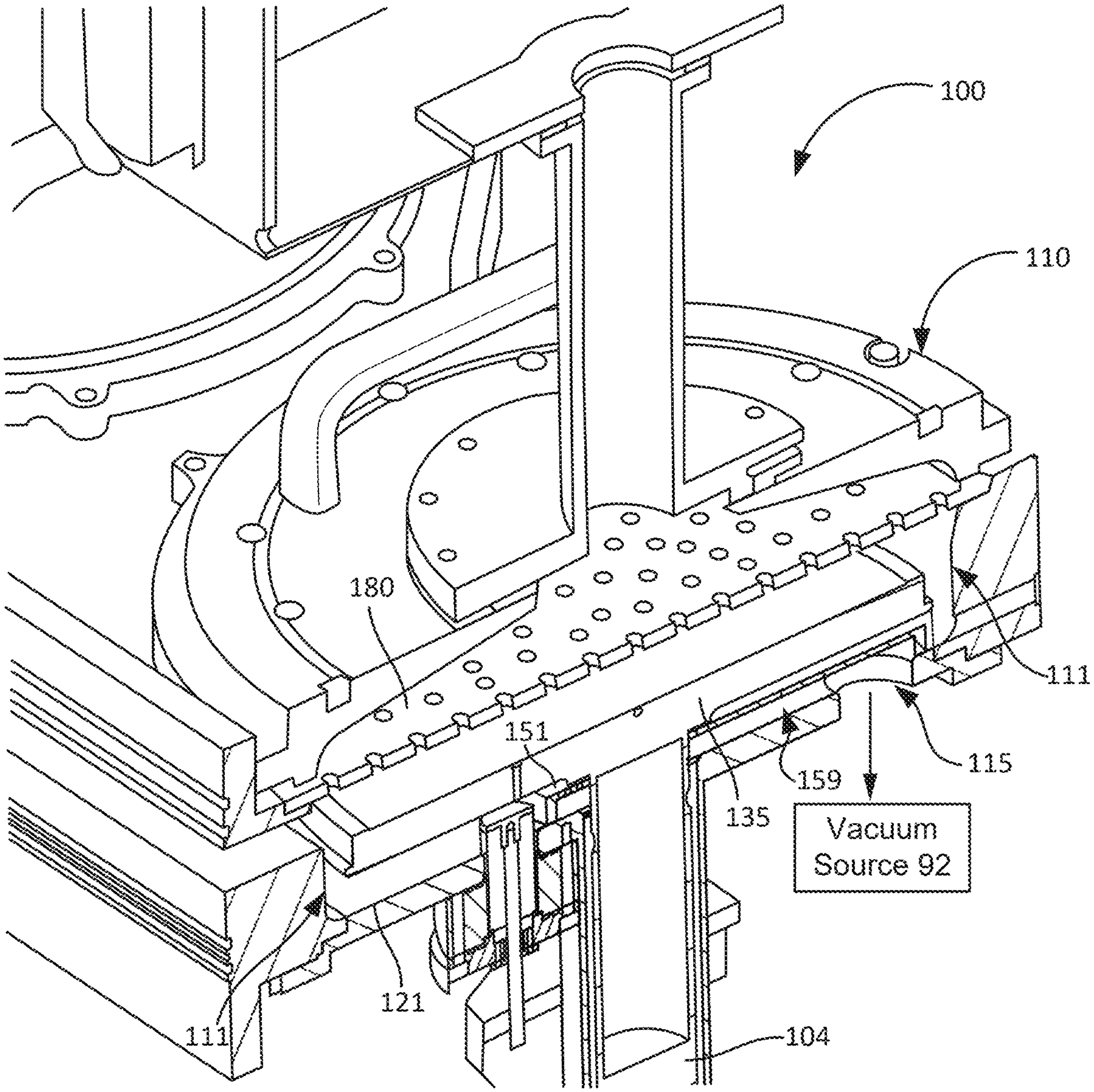
FIG. 2B depicts a perspective view of the reaction chamber cross-section of FIG. 2A, in accordance with various embodiments.

Turning to FIGS. 2A and 2B, the embodiments of the disclosure may include reactor systems and methods that may be utilized for processing a substrate within a reactor 100. In various embodiments, a reactor 100 may comprise a reaction chamber 110 for processing substrates. In various embodiments, reaction chamber 110 may comprise a reaction space 112 (i.e., an upper chamber), which may be configured for processing one or more substrates, and/or a lower chamber space 114 (i.e., a lower chamber). Lower chamber space 114 may be configured for the loading and unloading of substrates from the reaction chamber, and/or for providing a pressure differential between lower chamber space 114 and reaction space 112.

In various embodiments, the reactor system may comprise a susceptor (e.g., susceptor 130). The substrate 150 may be raised into a processing position (i.e., a raised position) within the reaction space (e.g., reaction space 112) and/or lowered into a loading position (i.e., a lower position), for example.

During operation, gas (e.g., precursors, reactant gases, carrier gases, and the like) may flow into reaction chamber 110 through fluid distribution system 180 (e.g., a showerhead) to contact substrate 150. A reaction chamber volume within reaction chamber 110 may be enclosed at least by sidewall system 111, fluid distribution system 180, and/or and reaction chamber floor 121. Vacuum source 92 may provide vacuum pressure, causing the gas to flow through reaction chamber 110 toward vacuum source 92. Vacuum source 92 may be in fluid communication with the reaction chamber volume via vacuum aperture 115 through reaction chamber floor 121. Without a baffle disposed in reaction chamber 110, the path of least resistance may the path closest to vacuum aperture 115 (e.g., fluid path 120A flowing nearest to vacuum source 92). Thus, the portion of substrate 150 closest to vacuum aperture 115 may receive contact from relatively more fluid than other portions of substrate 150. Therefore, there may be more deposition on such portions of substrate 150 closer to vacuum aperture 115 relative to other portions of substrate 150.

To create more uniform fluid (gas) flow within reaction chamber 110 and around substrate 150, a baffle 151 may be disposed in reaction chamber 110 to direct fluid along a desired path. Baffle 151 may cover vacuum aperture 115, and provide a fluid path through baffle apertures 167, into a baffle space 159 to flow toward vacuum source 92. Thus, fluid may flow along fluid paths 120A and 120B substantially equally, such that a substantially equal amount of fluid flows around the portions of substrate 150 ("substantially," as used in this context means, within 1, 5, 10 or 20 percent).

Figure 3:
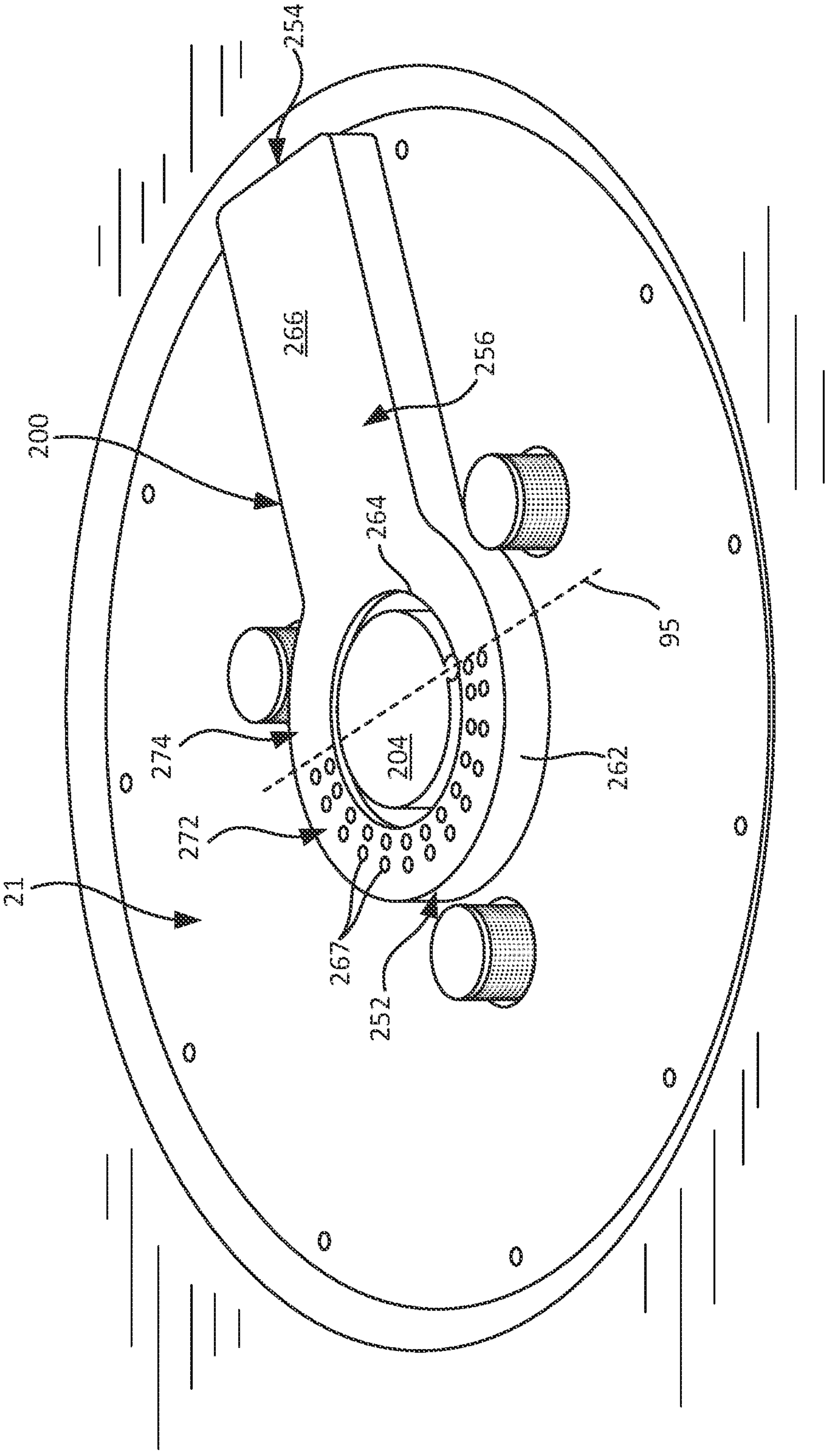
FIG. 3 depicts a baffle disposed on a reaction chamber floor, in accordance with various embodiments.
Figure 4A:
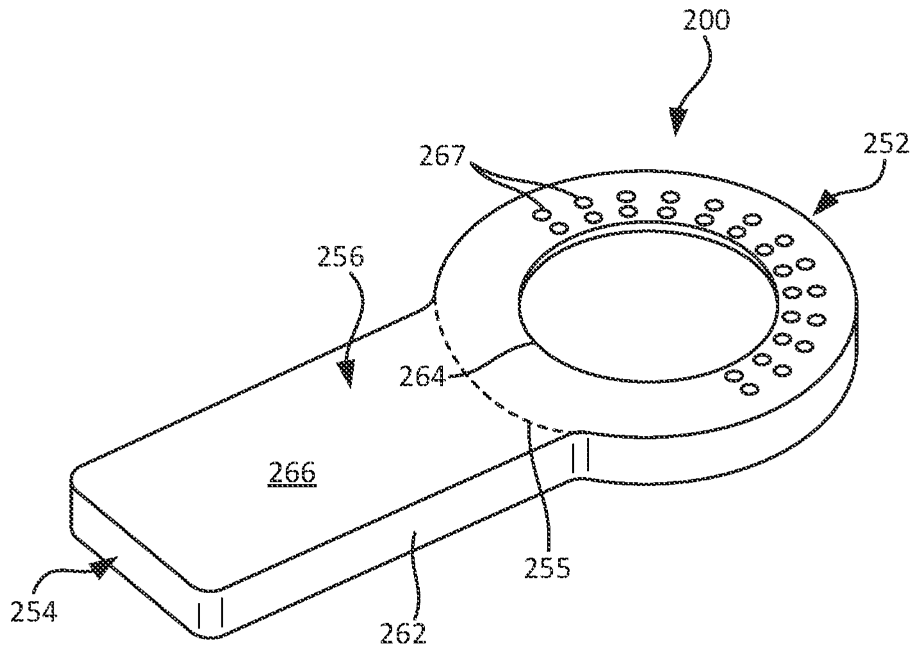
FIGS. 4A and 4B illustrate views of the baffle of FIG. 3, in accordance with various embodiments.
Figure 4B:
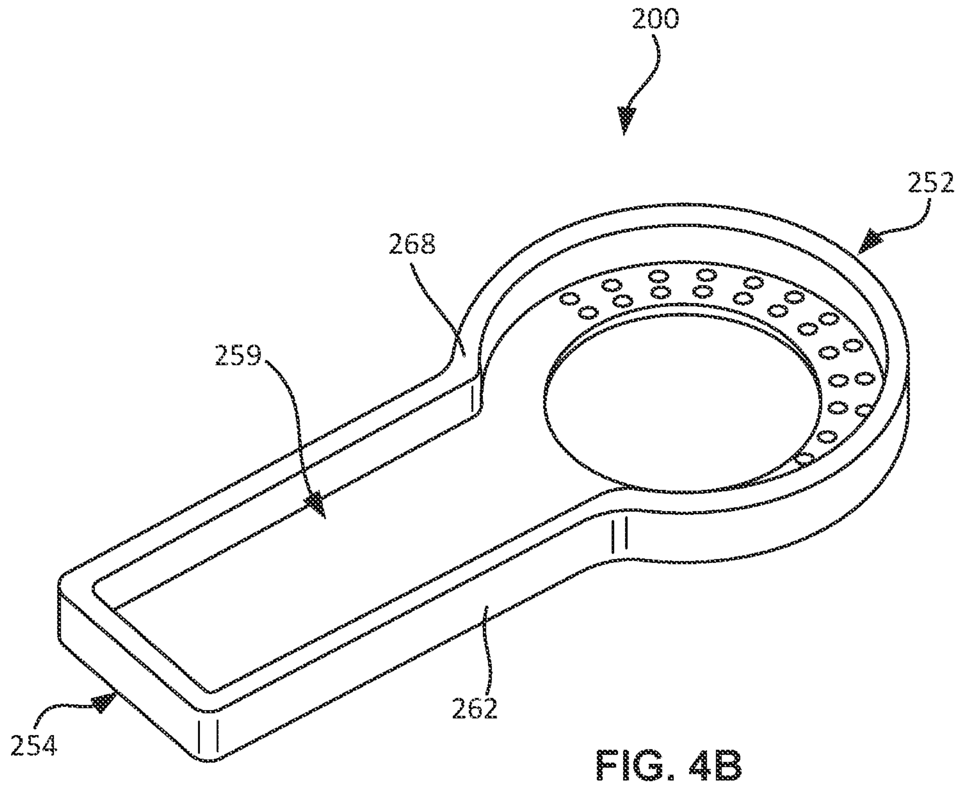

A baffle as described herein (e.g., baffle 151, 200) may cover a vacuum aperture in a reaction chamber and extend into any portion of the reaction chamber desired to direct fluid flow through the reaction chamber and toward the vacuum source. With reference to FIGS. 3 and 4A-4B, baffle 200 may comprise a baffle wall system spanning between a baffle first end 252 and a baffle second end 254. Baffle second end 254 may cover the vacuum void in the reaction chamber. Baffle 200 may comprise a baffle space 259 enclosed by the baffle wall system and reaction chamber floor 21 to which baffle 200 is coupled. That is, baffle 200 may comprise an open side that exposes the baffle space to the ambient environment unless coupled to another surface to enclose the baffle space. Baffle 200 may comprise a bottom surface 268, at which baffle 200 may couple to the reaction chamber floor. There may be at least a partial seal formed between the bottom surface 268 and the reaction chamber floor.

In various embodiments, one or more baffle apertures 267 may be disposed in baffle first end 252. Baffle apertures may be disposed in any suitable arrangement and may comprise any suitable size (e.g., baffle apertures in a baffle may comprise a uniform size or various sizes). Baffle first end 252 may be the portion of the baffle comprising a baffle aperture (thus, there may be a portion of a baffle further from baffle second end than the baffle first end, but the baffle first end comprises the baffle aperture(s) to direct fluid flow therethrough). In various embodiments, a baffle aperture may be disposed only through the baffle first end (e.g., and not through the baffle second end or in the baffle length between the baffle first and second ends). Baffle apertures 267 may be in fluid communication with baffle space 259. Thus, the reaction chamber volume may be in fluid communication with baffle space 259 via baffle apertures 267. In operation, fluid within a reaction chamber may flow from the reaction chamber volume, through baffle apertures 267 and baffle space 259, and through the vacuum aperture in the reaction chamber floor toward the vacuum source. Thus, the position of the baffle and the baffle aperture(s) disposed therethrough direct the flow of fluid from the reaction chamber to the vacuum source.

In various embodiments, the wall system of baffle 200 may comprise a sidewall system 262 surrounding baffle space 259 and an upper wall 266 configured to face the reaction chamber volume. A baffle aperture may be disposed in the sidewall system and/or the upper wall. For example, baffle 200 comprises baffle apertures disposed through upper wall 266 on baffle first end 252.

In various embodiments, a baffle first end of a baffle may comprise a distal portion and a proximal portion. The distal portion may be the portion of the baffle first end that is further from the baffle second end and/or the vacuum aperture in the reaction chamber. In various embodiments, the susceptor shaft in a reaction chamber may be disposed at least partially between the distal portion of the baffle first end and the baffle second end and/or the vacuum aperture in the reaction chamber. In various embodiments, the susceptor shaft in a reaction chamber may be disposed at least partially between at least one of the baffle apertures and the baffle second end and/or the vacuum aperture in the reaction chamber. For example, baffle 200 may comprise distal portion 272 of baffle first end 252 which is further from baffle second end 254 than proximal portion 274 of baffle first end 252. As shown in FIG. 3, distal portion 272 of baffle first end 252 may be the half of baffle first end 252 (shown by dividing line 95) that is further from baffle second end 254. In various embodiments, the distal portion of a baffle first end may be the half, third, or fourth (or any suitable portion of the baffle first end) that is furthest from the baffle second end and/or the vacuum aperture in the reaction chamber.

In various embodiments, the distal portion of a baffle first end may be a portion of the perimeter shape of the baffle first end. For example, baffle first end 252 of baffle 200 may comprise an arcuate or a circular perimeter shape (shown and completed by line 255 in FIG. 4A). Thus, the distal end of a baffle first end may be the half, third, fourth, etc. of the perimeter shape that is furthest from the baffle second end and/or the vacuum aperture in the reaction chamber. The perimeter shape of a baffle first end may be any suitable shape, such as rectangular, square, hexagonal, octagonal, oval, or the like (e.g., depending on the spatial arrangement within the reaction chamber, the desired fluid flow to achieve, a desired aperture arrangement, or the like), In various embodiments, the baffle aperture (or plurality of baffle apertures) may be disposed through the baffle first end at the distal portion thereof (e.g., on the upper surface and/or sidewall of the distal portion of the baffle first end). As shown in FIG. 3, baffle apertures 267 may be disposed only through distal portion 272 of baffle first end 252, with no baffle apertures through proximal portion 274 of baffle first end 252. In various embodiments, a majority of the baffle apertures disposed in the baffle first end may be disposed through the distal end relative to the proximal end of the baffle first end. In various embodiments, the baffle aperture (or plurality of baffle apertures) may be disposed through the baffle first end at the proximal portion thereof, or through the distal and proximal portions of the baffle first end.

In various embodiments, the baffle aperture(s) may be disposed proximate a center of the reaction chamber, susceptor, and/or substrate to direct fluid flow to the center of the reaction chamber. Thus, the vacuum aperture in the reaction chamber and the vacuum source may be positioned anywhere within the reaction chamber, and the baffle may direct fluid flow to the center of the reaction chamber, causing more uniform fluid path lengths toward the vacuum source around most or all portions of the susceptor and/or substrate.

In various embodiments, one or more baffle apertures may be disposed through the baffle second end or the baffle length (e.g., baffle length 256) between the baffle first end and the baffle second end.

In various embodiments, the baffle first end may be disposed at least partially around the susceptor shaft in a reaction chamber. For example, baffle 200 may comprise a baffle first end void 264, through which a susceptor shaft 204 may be disposed (e.g., susceptor shaft 104 shown in FIGS. 2A and 2B). A baffle may be disposed in a reaction chamber by coupling the baffle to the reaction chamber floor, and then disposing the susceptor shaft through the baffle first end void. Thus, existing reaction chambers may be retrofitted with a baffle to change the fluid flow patterns therein. Positioning the baffle first end at least partially around the susceptor shaft (which may be at the center of the reaction chamber volume) may advantageously position the baffle apertures disposed through the baffle first end at the center of the reaction chamber, susceptor, and/or substrate. Thus, the fluid path through the baffle apertures toward the vacuum source may create more uniform fluid path lengths toward the vacuum source around most or all portions of the susceptor and/or substrate.

In various embodiments, the baffle apertures through a baffle first end may be disposed at least partially around the susceptor shaft. For example, the baffle apertures may be disposed only on or proximate one side of the susceptor shaft (e.g., on the distal portion of the baffle first end), or all the way around the susceptor shaft on the baffle first end (e.g., such that the baffle apertures are equally or evenly distributed about the susceptor shaft).

Figure 5:
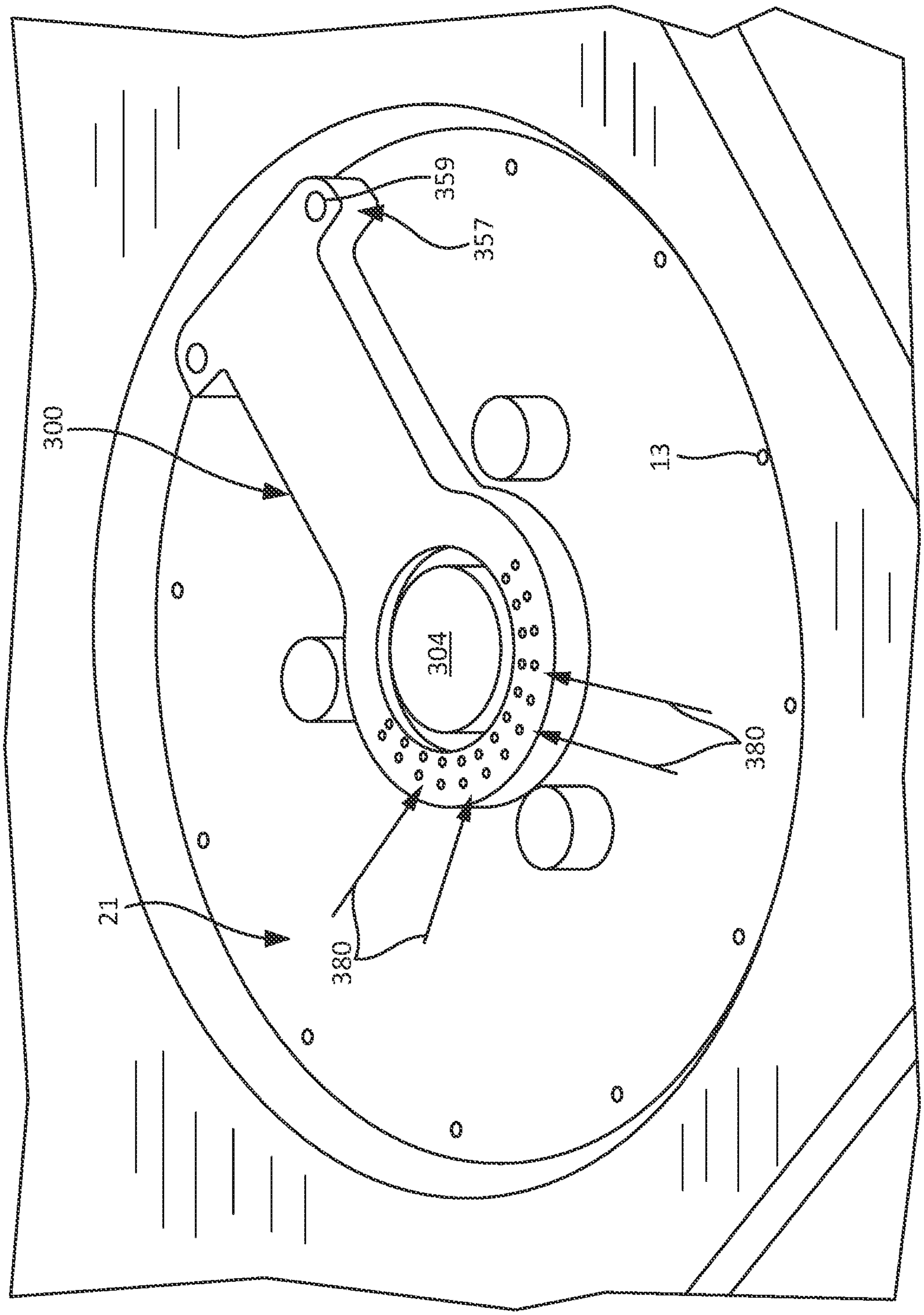
FIG. 5 depicts another baffle disposed on a reaction chamber floor, in accordance with various embodiments.

In various embodiments, a baffle may comprise a coupling hole through a portion of the baffle configured to receive a fastener to couple the baffle to the reaction chamber floor. For example, with reference to FIG. 5, reaction chamber floor 21 may comprise fastener holes 13 disposed therethrough configured to receive a fastener. Baffle 300 (similar to baffle 200) may comprise a tab(s) 357 protruding from the baffle second end. Tab(s) 357 may comprise a coupling hole 359 disposed therethrough configured to receive a fastener to couple baffle 300 to reaction chamber floor 21. Thus, the fasteners through coupling holes 359 and fastener holes 13 may couple baffle 300 to reaction chamber floor 21 and hold baffle 300 in place, allowing fluid 380 to flow through the baffle apertures and through the baffle space toward the vacuum source. In various embodiments, baffle 300 may include a void through which a susceptor shaft 304 may be disposed.

In various embodiments, a baffle may comprise any suitable material, such as a metal or metal alloy (e.g., steel, stainless steel, a nickel alloy, and/or the like), quartz, and/or a ceramic material.

In reaction chambers without a baffle, as discussed herein, there may be more deposition in portions on the substrate more proximate to the vacuum aperture in the reaction chamber. In such cases, in a reaction chamber having a vacuum aperture offset from a center of the reaction chamber, susceptor, and/or substrate, the flow deviation around the substrate, and the deposition deviation on the substrate, may be around 33%, with the bias toward the portion of the substrate more proximate to the vacuum aperture in the reaction chamber. In embodiments of a reaction chamber including a baffle, as discussed and depicted herein, the flow deviation around the substrate, and the deposition deviation on the substrate, may be around 8% or less, thus providing a great improvement in desired flow and deposition uniformity.

Although exemplary embodiments of the present disclosure are set forth herein, it should be appreciated that the disclosure is not so limited. For example, although reactor systems are described in connection with various specific configurations, the disclosure is not necessarily limited to these examples. Various modifications, variations, and enhancements of the system and method set forth herein may be made without departing from the spirit and scope of the present disclosure.

The subject matter of the present disclosure includes all novel and nonobvious combinations and subcombinations of the various systems, components, and configurations, and other features, functions, acts, and/or properties disclosed herein, as well as any and all equivalents thereof.

What is claimed is:

1. A reaction chamber, comprising:

a sidewall system;

a fluid distribution system;

a reaction chamber floor;

a reaction chamber volume at least partially enclosed by the sidewall system, the fluid distribution system, and the reaction chamber floor;

a susceptor disposed within the reaction chamber volume configured to support a substrate;

a susceptor shaft coupled to and supporting the susceptor, wherein the susceptor shaft is disposed through the reaction chamber floor at a center portion of the reaction chamber;

a vacuum source fluidly coupled to the reaction chamber volume via a vacuum aperture disposed through the reaction chamber floor, wherein the vacuum aperture is disposed toward a side of the reaction chamber, offset from the center portion; and a baffle coupled to the reaction chamber floor, wherein the baffle comprises a baffle first end and a baffle second end, wherein the baffle first end is disposed at the center portion of the reaction chamber and at least partially surrounding the susceptor shaft, and wherein the baffle second end is disposed over the vacuum aperture, wherein the baffle comprises a baffle space enclosed by a baffle wall system and the reaction chamber floor, wherein the baffle first end comprises a baffle aperture disposed therethrough configured to allow a fluid to flow from the reaction chamber volume through the baffle aperture at the center portion of the reaction chamber, into and along the baffle space toward the side of the reaction chamber and the second baffle end, and exit the baffle space through the vacuum aperture in the reaction chamber floor.

2. The reaction chamber of claim 1, wherein the reaction chamber volume is in fluid communication with the vacuum source via the baffle aperture and the baffle space in the baffle.

3. The reaction chamber of claim 1, wherein the baffle wall system forms at least a partial seal with the reaction chamber floor.

4. The reaction chamber of claim 1, wherein the baffle wall system comprises a baffle sidewall system surrounding the baffle space and a baffle upper wall facing the reaction chamber volume, wherein the baffle aperture is disposed in at least one of the baffle upper wall and the baffle sidewall system.

5. The reaction chamber of claim 1, wherein the baffle first end comprises a distal portion that is a baffle first end portion furthest from the vacuum aperture, wherein the baffle aperture is disposed in the distal portion.

6. The reaction chamber of claim 5, wherein the susceptor shaft is disposed between the vacuum aperture and at least a portion of the distal portion of the baffle first end.

7. The reaction chamber of claim 5, wherein the baffle first end comprises a perimeter shape comprising the distal portion, wherein the distal portion of the perimeter shape is a quarter, a third, or a half of the perimeter shape that is disposed furthest from the vacuum aperture.

8. The reaction chamber of claim 7, wherein the baffle comprises a plurality of baffle apertures disposed through the baffle wall system on the baffle first end.

9. The reaction chamber of claim 8, wherein the plurality of baffle apertures are disposed only on the distal portion of the baffle first end.

10. The reaction chamber of claim 8, wherein a majority of the baffle apertures are disposed on the distal portion of the baffle first end.

11. The reaction chamber of claim 1, wherein the baffle comprises at least one of a metal material, a ceramic material, or quartz.

12. The reaction chamber of claim 1, wherein the baffle first end comprises a baffle first end void, through which the susceptor shaft is disposed.

13. The reaction chamber of claim 12, wherein the baffle first end is disposed completely around the susceptor shaft.

* * * * *